(12) United States Patent
Ando

(10) Patent No.: US 11,584,887 B2
(45) Date of Patent: Feb. 21, 2023

(54) INORGANIC NANO FLUORESCENT PARTICLE COMPOSITE AND WAVELENGTH CONVERTING MEMBER

(71) Applicant: NIPPON ELECTRIC GLASS CO., LTD., Otsu (JP)

(72) Inventor: Tamio Ando, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 832 days.

(21) Appl. No.: 16/342,539

(22) PCT Filed: Nov. 7, 2017

(86) PCT No.: PCT/JP2017/040159
§ 371 (c)(1),
(2) Date: Apr. 17, 2019

(87) PCT Pub. No.: WO2018/092644
PCT Pub. Date: May 24, 2018

(65) Prior Publication Data
US 2019/0241805 A1 Aug. 8, 2019

(30) Foreign Application Priority Data
Nov. 17, 2016 (JP) .............................. JP2016-223920

(51) Int. Cl.
*C09K 11/02* (2006.01)
*C09K 11/54* (2006.01)
(Continued)

(52) U.S. Cl.
CPC ............ *C09K 11/883* (2013.01); *B82Y 20/00* (2013.01); *C03C 3/16* (2013.01); *C03C 3/247* (2013.01);
(Continued)

(58) Field of Classification Search
CPC ....... C09K 11/883; C09K 11/00; C09K 11/02; C09K 11/08; C09K 11/54; C09K 11/56;
(Continued)

(56) References Cited

U.S. PATENT DOCUMENTS

2008/0230750 A1* 9/2008 Gillies ................. C09K 11/641
977/774
2013/0011551 A1  1/2013 Zhou et al.
(Continued)

FOREIGN PATENT DOCUMENTS

CN  101717644 A  6/2010
CN  101723586 A  6/2010
(Continued)

OTHER PUBLICATIONS

Machine translation of JP2015-086284A, 23 pages. (Year: 2015).*
(Continued)

*Primary Examiner* — Matthew E. Hoban
*Assistant Examiner* — Lynne Edmondson
(74) *Attorney, Agent, or Firm* — Keating and Bennett, LLP

(57) ABSTRACT

Provided are an inorganic fluorescent nanoparticle composite that can suppress the degradation of inorganic fluorescent nanoparticles when sealed in glass and a wavelength conversion member using the inorganic fluorescent nanoparticle composite. An inorganic fluorescent nanoparticle composite 1 is made up by including: an inorganic fluorescent nanoparticle 2; and an inorganic fine particle 3 deposited on a surface of the inorganic fluorescent nanoparticle 2.

9 Claims, 1 Drawing Sheet

(51) Int. Cl.

| | |
|---|---|
| *C09K 11/62* | (2006.01) |
| *C09K 11/70* | (2006.01) |
| *H01L 33/50* | (2010.01) |
| *C09K 11/88* | (2006.01) |
| *C03C 3/16* | (2006.01) |
| *B82Y 20/00* | (2011.01) |
| *C03C 4/12* | (2006.01) |
| *C09K 11/56* | (2006.01) |
| *C09K 11/00* | (2006.01) |
| *C09K 11/74* | (2006.01) |
| *C09K 11/75* | (2006.01) |
| *C09K 11/64* | (2006.01) |
| *C03C 3/247* | (2006.01) |
| *C09K 11/08* | (2006.01) |

(52) U.S. Cl.
CPC .............. *C03C 4/12* (2013.01); *C09K 11/00* (2013.01); *C09K 11/02* (2013.01); *C09K 11/08* (2013.01); *C09K 11/54* (2013.01); *C09K 11/56* (2013.01); *C09K 11/62* (2013.01); *C09K 11/64* (2013.01); *C09K 11/70* (2013.01); *C09K 11/74* (2013.01); *C09K 11/75* (2013.01); *C09K 11/88* (2013.01); *H01L 33/50* (2013.01); *H01L 33/502* (2013.01)

(58) Field of Classification Search
CPC ....... C09K 11/565; C09K 11/62; C09K 11/64; C09K 11/70; C09K 11/74; C09K 11/75; C09K 11/88; C03C 3/16; C03C 3/247; C03C 4/12; C03C 12/00; C03C 14/006; H01L 33/502; B82Y 20/00
See application file for complete search history.

(56) References Cited

U.S. PATENT DOCUMENTS

| | | | |
|---|---|---|---|
| 2013/0257264 A1 | 10/2013 | Tamaki et al. | |
| 2013/0334557 A1 | 12/2013 | Uchida et al. | |
| 2014/0003074 A1* | 1/2014 | Kishimoto | F21S 45/10 252/301.36 |

FOREIGN PATENT DOCUMENTS

| | | |
|---|---|---|
| CN | 102863963 A | 1/2013 |
| JP | 62-177500 A | 8/1987 |
| JP | 10-195429 A | 7/1998 |
| JP | 2002-88358 A | 3/2002 |
| JP | 2010-83704 A | 4/2010 |
| JP | 2012-87162 A | 5/2012 |
| JP | 2013-525243 A | 6/2013 |
| JP | 2015-86284 A | 5/2015 |
| JP | 2015-89898 A | 5/2015 |
| WO | 2012/102107 A1 | 8/2012 |
| WO | 2012/161065 A1 | 11/2012 |

OTHER PUBLICATIONS

Machine translation of JP2012-087162 A, 12 pages. (Year: 2012).*
Official Communication issued in corresponding Chinese Patent Application No. 201780070264.6, dated Oct. 11, 2021.
Official Communication issued in corresponding Taiwanese Patent Application No. 106138934, dated Nov. 25, 2020.
Official Communication issued in International Patent Application No. PCT/JP2017/040159, dated Dec. 12, 2017.

* cited by examiner

[FIG. 1.]
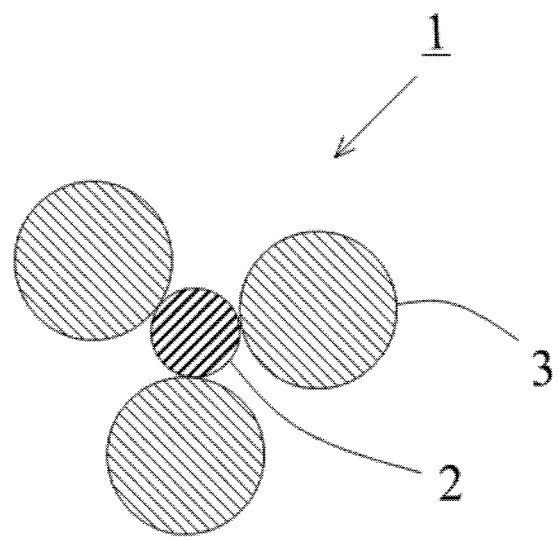
[FIG. 2.]
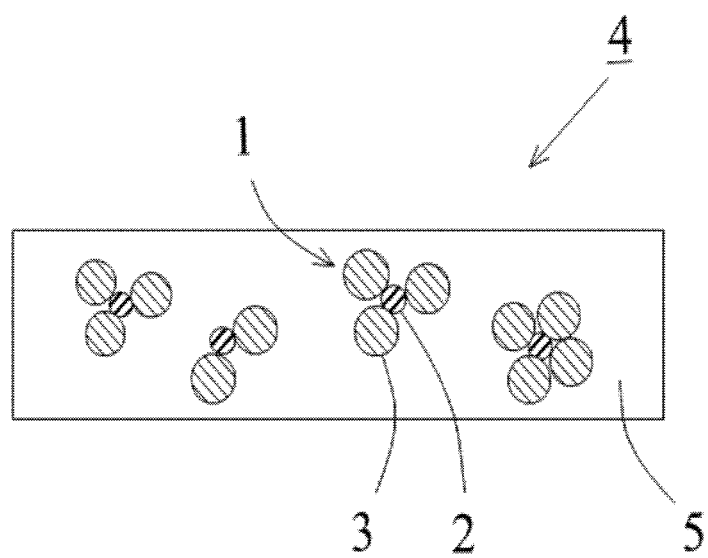

INORGANIC NANO FLUORESCENT PARTICLE COMPOSITE AND WAVELENGTH CONVERTING MEMBER

TECHNICAL FIELD

The present invention relates to inorganic fluorescent nanoparticle composites and wavelength conversion members using the same.

BACKGROUND ART

Recently, studies have been made on light emitting devices in which an excitation light source, such as a light emitting diode (LED) or a semiconductor laser diode (LD), is used and fluorescence generated by applying excitation light generated from the excitation light source to a phosphor is used as illuminating light. Furthermore, studies have also been made on the use, as a phosphor, of inorganic fluorescent nanoparticles, such as quantum dots. Quantum dots can be controlled in fluorescence wavelength by changing their diameter and have high luminous efficiency (see, for example, Patent Literatures 1 to 3).

Inorganic fluorescent nanoparticles have the property of easily degrading by contact with moisture or oxygen in the atmosphere. Therefore, inorganic fluorescent nanoparticles are used being sealed by resin or the like to avoid contact with the external environment. However, if resin is used as a sealing material, there arises a problem that the resin is discolored by heat generated from the inorganic fluorescent nanoparticles by irradiation with excitation light. In addition, resin is poor in water resistance and permeable to water, which presents a problem that the inorganic fluorescent nanoparticles are likely to degrade with time. To cope with these problems, studies have been made on the use, as a sealing material for inorganic fluorescent nanoparticles, of glass excellent in thermal resistance and water resistance (see, for example, Patent Literature 4).

CITATION LIST

Patent Literature

[PTL 1]
WO 2012/102107
[PTL 2]
WO 2012/161065
[PTL 3]
JP-A-2013-525243
[PTL 4]
JP-A-2012-87162

SUMMARY OF INVENTION

Technical Problem

If glass is used as a sealing material for inorganic fluorescent nanoparticles, the wavelength conversion member itself has excellent thermal resistance and water resistance, but there arises a problem that the inorganic fluorescent nanoparticles themselves may degrade by reaction with the glass. As a result, a wavelength conversion member having a desired luminous efficiency may be less likely to be obtained.

In view of the foregoing, the present invention has an object of providing an inorganic fluorescent nanoparticle composite that can suppress the degradation of inorganic fluorescent nanoparticles when sealed in glass, and providing a wavelength conversion member using the inorganic fluorescent nanoparticle composite.

Solution to Problem

An inorganic fluorescent nanoparticle composite according to the present invention is made up by including: an inorganic fluorescent nanoparticle; and an inorganic fine particle deposited on a surface of the inorganic fluorescent nanoparticle. By doing so, when the inorganic fluorescent nanoparticle composite is sealed in glass, the inorganic fine particles are likely to be interposed between the inorganic fluorescent nanoparticles and the glass. As a result, the contact of the inorganic fluorescent nanoparticles with the glass is suppressed, so that the degradation of the inorganic fluorescent nanoparticles due to reaction with the glass can be suppressed. Therefore, the luminous efficiency of the wavelength conversion member can be easily improved.

In the inorganic fluorescent nanoparticle composite according to the present invention, the inorganic fine particles preferably have a larger average particle diameter than the inorganic fluorescent nanoparticles. Thus, the contact of the inorganic fluorescent nanoparticles with the glass in the wavelength conversion member can be effectively suppressed.

In the inorganic fluorescent nanoparticle composite according to the present invention, the inorganic fine particles preferably have an average particle diameter of 1 to 1000 nm.

In the inorganic fluorescent nanoparticle composite according to the present invention, the inorganic fine particle is preferably made of alumina, silica, zirconia, zinc oxide, titanium oxide or cerium oxide.

In the inorganic fluorescent nanoparticle composite according to the present invention, the inorganic fluorescent nanoparticles preferably have an average particle diameter of 1 to 100 nm.

In the inorganic fluorescent nanoparticle composite according to the present invention, the inorganic fluorescent nanoparticle is preferably a quantum dot phosphor made of at least one member selected from the group consisting of CdS, CdSe, CdTe, ZnS, ZnSe, ZnTe, InP, GaN, GaAs, GaP, AlN, AlP, AlSb, InN, InAs, and InSb or a composite of two or more members selected from the group.

A wavelength conversion member according to the present invention is formed of a sintered body of the above-described inorganic fluorescent nanoparticle composite and a glass powder.

In the wavelength conversion member according to the present invention, the glass powder is preferably made of a Sn—P-based glass or a Sn—P—F-based glass.

In the wavelength conversion member according to the present invention, the glass powder preferably has an average particle diameter of 0.1 to 100 μm.

Advantageous Effects of Invention

The present invention enables provision of an inorganic fluorescent nanoparticle composite that can suppress the degradation of inorganic fluorescent nanoparticles when sealed in glass, and provision of a wavelength conversion member using the inorganic fluorescent nanoparticle composite.

BRIEF DESCRIPTION OF DRAWINGS

FIG. 1 is a schematic cross-sectional view of an inorganic fluorescent nanoparticle composite according to one embodiment of the present invention.

FIG. 2 is a schematic cross-sectional view of a wavelength conversion member according to one embodiment of the present invention.

DESCRIPTION OF EMBODIMENTS

Hereinafter, a description will be given of a preferred embodiment. However, the following embodiment is merely illustrative and the present invention is not limited to the following embodiment. Throughout the drawings, members having substantially the same functions may be referred to by the same reference characters.

FIG. 1 is a schematic cross-sectional view of an inorganic fluorescent nanoparticle composite according to an embodiment of the present invention. An inorganic fluorescent nanoparticle composite 1 according to this embodiment includes inorganic fluorescent nanoparticles 2 and inorganic fine particles 3 deposited on the surfaces of the inorganic fluorescent nanoparticles 2. Specifically, the inorganic fluorescent nanoparticle composite 1 is formed so that a plurality of inorganic fine particles 3 are deposited on the surface of an inorganic fluorescent nanoparticle 2 to surround the inorganic fluorescent nanoparticle 2.

FIG. 2 is a schematic cross-sectional view of a wavelength conversion member according to an embodiment of the present invention. A wavelength conversion member 4 according to this embodiment has a structure in which the inorganic fluorescent nanoparticle composite 1 described above is dispersed in a glass matrix 5.

As shown in FIGS. 1 and 2, since the inorganic fluorescent nanoparticle composite 1 has a structure in which inorganic fine particles 3 are deposited on the surface of each inorganic fluorescent nanoparticle 2, the contact of the inorganic fluorescent nanoparticles 2 with the glass matrix 5 in the wavelength conversion member 4 are suppressed. Therefore, the degradation of the inorganic fluorescent nanoparticles 2 due to reaction with the glass matrix 5 can be suppressed, so that the luminous efficiency of the wavelength conversion member 4 can be easily improved. Particularly, in the case where the glass matrix 5 is made of a sintered body of a glass powder, the use of the inorganic fluorescent nanoparticle composite 1 according to this embodiment enables effective suppression of the contact of each inorganic fluorescent nanoparticle 2 with the glass matrix 5. The reason for this can be that since a plurality of inorganic fine particles 3 surround the inorganic fluorescent nanoparticle 2, the glass powder is less likely to enter gaps between the plurality of inorganic fine particles 3.

Examples of the inorganic fluorescent nanoparticle 2 include quantum dot phosphors of CdS, CdSe, CdTe, ZnS, ZnSe, ZnTe, InP, GaN, GaAs, GaP, AlN, AlP, AlSb, InN, InAs, InSb, and so on. These types of quantum dot phosphors can be used alone or in a mixture of two or more thereof. Alternatively, a composite formed of two or more of these types (for example, a core-shell structure in which the surface of a CdSe particle is coated with ZnS) may be used. Still alternatively, examples of the inorganic fluorescent nanoparticle that can be used includes, other than the quantum dot phosphors, inorganic particles of oxides, nitrides, oxynitrides, sulfides, oxysulfides, rare earth sulfides, aluminate chlorides, halophosphate chlorides, and so on. These types of inorganic particles can be used alone or in a mixture of two or more thereof. No particular limitation is placed on the average particle diameter of the inorganic fluorescent nanoparticles, but it is preferably 1 to 100 nm, more preferably 1 to 50 nm, even more preferably 1 to 30 nm, still more preferably 1 to 15 nm, and yet still more preferably about 1.5 to 12 nm. As used herein, the average particle diameter refers to a value (D50) measured in conformity with JIS-R1629.

The luminous efficiency of the wavelength conversion member 4 varies depending upon the type and content of inorganic fluorescent nanoparticles 2 dispersed in the glass matrix 5 and the thickness of the wavelength conversion member 4. If there is a desire to increase the luminous efficiency, the luminous efficiency can be controlled by reducing the thickness of the wavelength conversion member 4 to increase the fluorescence or excitation light transmittance or by increasing the content of inorganic fluorescent nanoparticles 2 to increase the amount of fluorescence. However, if the content of the inorganic fluorescent nanoparticles 2 is too large, sintering is less likely to progress during production and the porosity increases, which presents problems, such as difficulty in efficiently irradiating the inorganic fluorescent nanoparticles 2 with excitation light and ease of reduction in the mechanical strength of the wavelength conversion member 4. On the other hand, if the content of the inorganic fluorescent nanoparticles 2 is too small, a sufficient luminescence intensity is less likely to be achieved. Therefore, the content of the inorganic fluorescent nanoparticles 2 in the wavelength conversion member 4 is preferably appropriately controlled in a range of, preferably 0.01 to 30% by mass, more preferably 0.05 to 10% by mass, and particularly preferably 0.08 to 5% by mass.

Examples of the inorganic fine particle 3 include ceramic particles of alumina, silica, zirconia, zinc oxide, titanium oxide, cerium oxide, and so on. These types of ceramic particles can be used alone or in a mixture of two or more thereof. Alternatively, the inorganic fine particle 3 may be an aggregate (a secondary particle) formed of a plurality of particles. The average particle diameter of the inorganic fine particles 3 is preferably 1 to 1000 nm, more preferably 5 to 500 nm, still more preferably 8 to 100 nm, and particularly preferably 10 to 20 nm. If the average particle diameter of the inorganic fine particles 3 is too small or too large, the effect of suppressing the contact of each inorganic fluorescent nanoparticle 2 with the glass matrix 5 is less likely to be achieved. If the inorganic fine particles 3 have a larger average particle diameter than the inorganic fluorescent nanoparticles 2, this is preferred because the contact of each inorganic fluorescent nanoparticle 2 with the glass matrix 5 can be effectively suppressed.

The content of the inorganic fine particles 3 is, relative to 1 part by weight of inorganic fluorescent nanoparticles 2, preferably 10 to 10000 parts by mass, more preferably 50 to 5000 parts by mass, still more preferably 100 to 1000 parts by mass, yet still more preferably 200 to 500 parts by mass. If the content of the inorganic fluorescent nanoparticles 2 is too small, the effect of suppressing the contact of each inorganic fluorescent nanoparticle 2 with the glass matrix 5 is less likely to be achieved. On the other hand, if the content of the inorganic fluorescent nanoparticles 2 is too large, the degree of light scattering inside the wavelength conversion member 4 becomes large, so that the luminous efficiency may decrease.

The deformation point of the glass matrix 5 is preferably 380° C. or less, more preferably 300° C. or less, and particularly preferably 200° C. or less. If the deformation point of the glass matrix 5 is too high, the sintering temperature during production of the wavelength conversion member 4 accordingly becomes high, so that the inorganic fluorescent nanoparticles 2 are likely to degrade. On the other hand, no particular limitation is placed on the lower limit of the deformation point of the glass matrix 5, but it is, on a realistic level, preferably 100° C. or more and particularly preferably 120° C. or more. The term deformation point used herein refers to a point when a specimen measured with a thermal expansion coefficient measurement (TMA) device exhibited a maximum elongation, i.e., a value when the elongation of the specimen was arrested.

The preferred glasses for the glass matrix 5 are Sn- and P-based glasses having low deformation points, such as Sn—P-based glasses, Sn—P—B-based glasses, and Sn—P—F-based glasses. Among them, Sn—P—F-based glasses that can be easily decreased in deformation point are preferably used. Examples of specific compositions of the Sn—P—F-based glasses include those containing, in % by cation, 10 to 90% $Sn^{2+}$ and 10 to 70% $P^{5+}$ and, in % by anion, 30 to 99.9% $O^{2-}$ and 0.1 to 70% $F^-$. The reasons why the contents of the components are limited as just described will be described below. In the following description of the contents of the components, "%" means "% by cation" or "% by anion", unless otherwise specified.

$Sn^{2+}$ is a component for improving the chemical durability and the weathering resistance. $Sn^{2+}$ also has the effect of decreasing the deformation point. The content of $Sn^{2+}$ is preferably 10 to 90%, more preferably 20 to 85%, and particularly preferably 25 to 82.5%. If the content of $Sn^{2+}$ is too small, the above effects are less likely to be achieved. On the other hand, if the content of $Sn^{2+}$ is too large, vitrification is less likely to be achieved and the resistance to devitrification is likely to decrease.

$P^{5+}$ is a component for forming the glass network. $P^{5+}$ also has the effect of increasing the light transmittance. In addition, $P^{5+}$ has the effect of suppressing devitrification and the effect of decreasing the deformation point. The content of $p^{5+}$ is preferably 10 to 70%, more preferably 15 to 60%, and particularly preferably 20 to 50%. If the content of $P^{5+}$ is too small, the above effects are less likely to be achieved. On the other hand, if the content of $P^{5+}$ is too large, the content of $Sn^{2+}$ becomes relatively small, so that the weathering resistance is likely to decrease.

The content of $P^{5+}$ and $Sn^{2+}$ is preferably 50% or more, more preferably 70.5% or more, still more preferably 75% or more, yet still more preferably 80% or more, and particularly preferably 85% or more. If the content of $P^{5+}$ and $Sn^{2+}$ is too small, the resistance to devitrification and the mechanical strength are likely to decrease. No particular limitation is placed on the upper limit of the content of $P^{5+}$ and $Sn^{2+}$ and it may be 100%, but, if the glass matrix contains another or other components, the upper limit may be 99.9% or less, 99% or less, 95% or less, or 90% or less.

The glass matrix may contain, as cation components, the following components other than the above components.

$B^{3+}$, $Zn^{2+}$, $Si^{4+}$, and $Al^{3+}$ are components for forming the glass network and, particularly, have a significant effect of improving the chemical durability. The content of $B^{3+}$+$Zn^{2+}$+$Si^{4+}$+$Al^{3+}$ is preferably 0 to 50%, more preferably 0 to 30%, still more preferably 0.1 to 25%, yet still more preferably 0.5 to 20%, and particularly preferably 0.75 to 15%. If the content of $B^{3+}$+$Zn^{2+}$+$Si^{4+}$+$Al^{3+}$ is too large, the resistance to devitrification is likely to decrease. In addition, Sn metal or the like precipitates with increasing melting temperature, so that the light transmittance is likely to decrease. In addition, the deformation point is likely to increase. From the viewpoint of improving the weathering resistance, the glass matrix preferably contains 0.1% or more $B^{3+}$+$Zn^{2+}$+$Si^{4+}$+$Al^{3+}$. Note that "(component)+(component)+ . . . " herein means the total of the contents of the relevant components.

The respective preferred content ranges of components $B^{3+}$, $Zn^{2+}$, $Si^{4+}$, and $Al^{3+}$ are as follows.

$B^{3+}$ is a component for forming the glass network. In addition, $B^{3+}$ has the effect of improving the weathering resistance and, particularly, has a significant effect of suppressing selective elution of $P^{5+}$ or other components of the glass into water. The content of $B^{3+}$ is preferably 0 to 50%, more preferably 0.1 to 45%, and particularly preferably 0.5 to 40%. If the content of $B^{3+}$ is too large, the resistance to devitrification and the light transmittance tend to decrease.

$Zn^{2+}$ is a component acting as a flux. In addition, $Zn^{2+}$ has the effect of improving the weathering resistance, the effect of suppressing elution of glass components into various types of cleaning solution, such as abrasive cleaning water, and the effect of suppressing the alteration of the glass surface in conditions of heat and humidity. Furthermore, $Zn^{2+}$ also has the effect of stabilizing vitrification. In view of these aspects, the content of $Zn^{2+}$ is preferably 0 to 40%, more preferably 0.1 to 30%, and particularly preferably 0.2 to 20%. If the content of $Zn^{2+}$ is too large, the resistance to devitrification and the light transmittance tend to decrease.

$Si^{4+}$ is a component for forming the glass network. In addition, $Si^{4+}$ has the effect of improving the weathering resistance and, particularly, has a significant effect of suppressing selective elution of $P^{5+}$ or other components of the glass into water. The content of $Si^{4+}$ is preferably 0 to 20% and particularly preferably 0.1 to 15%. If the content of $Si^{4+}$ is too large, the deformation point is likely to be high. In addition, striae or seeds due to unmelt are likely to be left in the glass.

$Al^{3+}$ is a component capable of forming the glass network, together with $Si^{4+}$ and $B^{3+}$. In addition, $Al^{3+}$ has the effect of improving the weathering resistance and, particularly, has a significant effect of suppressing selective elution of $P^{5+}$ or other components of the glass into water. The content of $Al^{3+}$ is preferably 0 to 20% and particularly preferably 0.1 to 15%. If the content of $Al^{3+}$ is too large, the resistance to devitrification and the light transmittance tend to decrease. In addition, the melting temperature becomes high, so that striae or seeds due to unmelt are likely to be left in the glass.

$Mg^{2+}$, $Ca^{2+}$, $Sr^{2+}$, and $Ba^{2+}$ (alkaline earth metal ions) are components acting as a flux. In addition, these components have the effect of improving the weathering resistance, the effect of suppressing elution of glass components into various types of cleaning solution, such as abrasive cleaning water, and the effect of suppressing the alteration of the glass surface in conditions of heat and humidity. Furthermore, they are components for increasing the hardness of the glass. However, if the content of these components is too large, the resistance to devitrification is likely to decrease. Therefore, the content of $Mg^{2+}$, $Ca^{2+}$, $Sr^{2+}$, and $Ba^{2+}$ is preferably 0 to 10%, more preferably 0 to 7.5%, still more preferably 0.1 to 5%, and particularly preferably 0.2 to 1.5%.

$Li^+$ is a component having the largest effect of decreasing the deformation point among alkali metal oxides. However, $Li^+$ has high phase separability. Therefore, if the content of $Li^+$ is too large, the resistance to devitrification is likely to decrease. Furthermore, $Li^+$ is likely to decrease the chemical durability and also likely to decrease the light transmittance. Therefore, the content of $Li^+$ is preferably 0 to 10%, more preferably 0 to 5%, still more preferably 0 to 1%, and particularly preferably 0 to 0.1%.

$Na^+$ has, like $Li^+$, the effect of decreasing the deformation point. However, if its content is too large, striae are likely to occur. In addition, the resistance to devitrification is likely to decrease. Furthermore, $Na^+$ is likely to decrease the chemical durability and also likely to decrease the light transmittance. Therefore, the content of $Na^+$ is preferably 0 to 10%, more preferably 0 to 5%, still more preferably 0 to 1%, and particularly preferably 0 to 0.1%.

$K^+$ has, like $Li^+$, the effect of decreasing the deformation point. However, if its content is too large, the weathering resistance tends to decrease. In addition, the resistance to devitrification is likely to decrease. Furthermore, $K^+$ is likely to decrease the chemical durability and also likely to decrease the light transmittance. Therefore, the content of $K_2O$ is preferably 0 to 10%, more preferably 0 to 5%, still more preferably 0 to 1%, and particularly preferably 0 to 0.1%.

The content of $Li^+$, $Na^+$, and $K^+$ is preferably 0 to 10%, more preferably 0 to 5%, still more preferably 0 to 1%, and particularly preferably 0 to 0.1%. If the content of $Li^+$, $Na^+$, and $K^+$ is too large, devitrification is likely to occur and the chemical durability tends to decrease.

Aside from the above components, the glass matrix may contain $La^{3+}$, $Gd^{3+}$, $Ta^{5+}$, $W^{6+}$, $Nb^{5+}$, $Ti^{4+}$, $Y^{3+}$, $Yb^{3+}$, $Ge^{4+}$, $Te^{4+}$, $Bi^{3+}$, $Zr^{4+}$, and so on up to 10% in total.

Rare earth components, such as $Ce^{4+}$, $Pr^{3+}$, $Nd^{3+}$, $Eu^{3+}$, $Tb^{3+}$, and $Er^{3+}$, and $Fe^{3+}$, $Ni^{2+}$, and $Co^{2+}$ are components for decreasing the light transmittance. Therefore, the content of each of these components is preferably 0.1% or less and the glass matrix is more preferably free of these components.

$In^{3+}$ is highly likely to cause devitrification and, therefore, the glass matrix is preferably free of $In^{3+}$.

Furthermore, for environmental reasons, the glass matrix is preferably free of $Pb^{2+}$ and $As^{3+}$.

An anion component, $F^-$, has the effect of decreasing the deformation point and the effect of increasing the light transmittance. However, if its content is too large, the volatility during melting becomes high, so that striae are likely to occur. In addition, the resistance to devitrification is likely to decrease. The content of $F^-$ is preferably 0.1 to 70%, more preferably 1 to 67.5%, still more preferably 5 to 65%, yet still more preferably 2 to 60%, and particularly preferably 10 to 60%. Examples of a material for introducing $F^-$ include, other than $SnF_2$, fluorides of La, Gd, Ta, W, Nb, Y, Yb, Ge, Mg, Ca, Sr, Ba, and so on.

The glass matrix generally contains $O^{2-}$ as an anion component other than $F^-$. In other words, the content of $O^{2-}$ depends on the content of $F^-$. Specifically, the content of $O^{2-}$ is preferably 30 to 99.9%, more preferably 32.5 to 99%, still more preferably 35 to 95%, yet still more preferably 40 to 98%, and particularly preferably 40 to 90%.

Examples of the Sn—P-based glasses include those containing, in % by mole, 50 to 80% SnO, 15 to 25% $P_2O_5$ (exclusive of 25%), 0 to 3% $ZrO_2$, 0 to 10% $Al_2O_3$, 0 to 10% $B_2O_3$, 0 to 10% $Li_2O$, 0 to 10% $Na_2O$, 0 to 10% $K_2O$, 0 to 10% $Li_2O+Na_2O+K_2O$, 0 to 10% MgO, 0 to 3% CaO, 0 to 2.5% SrO, 0 to 2% BaO, 0 to 11% MgO+CaO+SrO+BaO, and 0 to 10% $ZrO_2+Al_2O_3+MgO$ and having a ratio of $SnO/P_2O_5$ of 1.6 to 4.8.

The glass matrix 5 is preferably made of a glass powder. Specifically, the wavelength conversion member 4 is preferably formed of a sintered body of the inorganic fluorescent nanoparticle composite 1 and a glass powder. By doing so, a wavelength conversion member 4 can be easily produced in which the inorganic fluorescent nanoparticle composite 1 is homogeneously dispersed in the glass matrix 5.

The average particle diameter of the glass powder is preferably 0.1 to 100 µm, more preferably 1 to 80 µm, still more preferably 5 to 60 µm, yet still more preferably 10 to 50 µm, and particularly preferably 15 to 40 µm. If the average particle diameter of the glass powder is too small, the glass is likely to make contact with the inorganic fluorescent nanoparticles 2, so that the inorganic fluorescent nanoparticles 2 are likely to degrade. In addition, seeds may be formed during sintering, so that the mechanical strength of the wavelength conversion member 4 may decrease. Furthermore, the degree of light scattering inside the wavelength conversion member 4 becomes large, so that the luminous efficiency may decrease. On the other hand, if the average particle diameter of the glass powder is too large, the inorganic fluorescent nanoparticle composite 1 is less likely to be homogeneously dispersed in the glass matrix 5, so that the luminous efficiency of the wavelength conversion member 4 may decrease.

The shape of the wavelength conversion member 4 is normally a platy shape, such as a rectangular plate shape or a disk shape. In this case, the thickness of the wavelength conversion member 4 is preferably 0.03 to 1 mm, more preferably 0.05 to 0.5 mm, and particularly preferably 0.1 to 0.3 mm. If the thickness of the wavelength conversion member 4 is too small, its mechanical strength tends to be poor. On the other hand, if the thickness of the wavelength conversion member 4 is too large, the sintering time becomes long, so that the inorganic fluorescent nanoparticles 2 are likely to degrade. Alternatively, sintering tends to become insufficient.

The wavelength conversion member 4 can be used as a light-emitting device in combination with an excitation light source, such as an LED or an LD.

The inorganic fluorescent nanoparticle composite 1 and the wavelength conversion member 4 can be produced, for example, in the following manners.

The inorganic fluorescent nanoparticle composite 1 can be produced by mixing the inorganic fluorescent nanoparticles 2 and the inorganic fine particles 3. In the case where the inorganic fluorescent nanoparticles 2 are quantum dots, they are normally treated as being dispersed in an organic dispersion medium or the like. Then, the inorganic fine particles 3 are mixed into the organic dispersion medium containing the inorganic fluorescent nanoparticles 2 dispersed therein, and the organic dispersion medium is then volatilized, so that the inorganic fluorescent nanoparticle composite 1 can be obtained.

Next, a glass powder which will form a glass matrix 5 is mixed with the inorganic fluorescent nanoparticle composite 1 and the mixture is fired, so that a wavelength conversion member 4 can be obtained. The firing temperature is preferably within ±50° C. from the deformation point of the glass powder. Specifically, the firing temperature is preferably 380° C. or less, more preferably 300° C. or less, still more preferably 200° C. or less, and particularly preferably 180° C. or less. If the firing temperature is too high, the inorganic fluorescent nanoparticles 2 are likely to degrade and the luminous efficiency of the wavelength conversion member 4 is likely to decrease by reaction between the inorganic fluorescent nanoparticles 2 and the glass powder. On the other hand, if the firing temperature is too low, the sintering of the glass powder becomes insufficient, so that the porosity of the wavelength conversion member 4 tends to be high. As a result, light scattering in the wavelength conversion member 4 becomes intense, so that the fluorescence (or excitation light) extraction efficiency is likely to decrease. Therefore, the firing temperature is preferably not less than 130° C.

When the mixture of the inorganic fluorescent nanoparticle composite 1 and the glass powder is hot-pressed, softening and fluidization of the glass powder are promoted, so that the mixture can be sintered in an extremely short time. Thus, the thermal energy applied to the inorganic fluorescent nanoparticles 2 during firing can be largely reduced, so that the thermal degradation of the inorganic fluorescent nanoparticles 2 can be significantly suppressed. In addition, a thin wavelength conversion member 4 can be easily produced.

EXAMPLES

The present invention will be described below in further detail with reference to a specific example. However, the present invention is not at all limited to the following example and modifications and variations may be appropriately made without changing the gist of the invention.

Example

An amount of 0.19 g (288 parts by mass relative to 1 part by mass of inorganic fluorescent nanoparticles) of alumina particles (having an average particle diameter of 13 nm) were added into 100 µl of dispersion liquid containing inorganic fluorescent nanoparticles (CdSe/ZnS, average particle diameter: 3 nm) dispersed at a concentration of 1% by mass in hexane as a dispersion medium, the particles and the liquid were mixed, and the dispersion medium was volatilized to coat the surfaces of the inorganic fluorescent nanoparticles with alumina particles, thus obtaining an inorganic fluorescent nanoparticle composite.

An amount of 0.009 g of inorganic fluorescent nanoparticle composite was mixed with 0.991 g of Sn—P—F-based glass powder (average particle diameter: 25 µm, deformation point: 160° C.), thus obtaining a mixture. The obtained mixture was hot-pressed at 180° C. in an atmosphere of nitrogen. Thus, a platy wavelength conversion member was obtained.

Comparative Example

A wavelength conversion member was produced in the same manner as in Example except that the inorganic fluorescent nanoparticles were used, without being coated with alumina particles, as they were.

(Measurement of Luminescent Quantum Efficiency)

The obtained wavelength conversion members were measured in terms of luminescent quantum efficiency and compared relative to each other. As a result, while the luminescent quantum efficiency of the wavelength conversion member in Comparative Example was 100 a.u. (arbitrary unit), the luminescent quantum efficiency of the wavelength conversion member in Example was 791 a.u., exhibiting a luminescent quantum efficiency about 7.9 times greater than that in Comparative Example.

Note that the luminescent quantum efficiency herein refers to a value calculated by the following equation and was measured using an absolute PL quantum yield spectrometer (manufactured by Hamamatsu Photonics K.K.).

Luminescent quantum efficiency={(number of photons emitted as luminescence from sample)/(number of photons absorbed by sample)}×100 (%)

REFERENCE SIGNS LIST 1 inorganic fluorescent nanoparticle composite
2 inorganic fluorescent nanoparticle
3 inorganic fine particle
4 wavelength conversion member
5 glass matrix

The invention claimed is:

1. An inorganic fluorescent nanoparticle composite comprising:
   an inorganic fluorescent nanoparticle; and
   an inorganic fine particle deposited on a surface of the inorganic fluorescent nanoparticle; wherein
   a plurality of the inorganic fine particles are deposited on the surface of the inorganic fluorescent nanoparticle to surround the inorganic fluorescent nanoparticle;
   an average particle diameter of the inorganic fine particles is larger than an average particle diameter of the inorganic fluorescent nanoparticles; and
   a content of the inorganic fine particles is, relative to 1 part by mass of inorganic fluorescent nanoparticles, 10 parts by mass or more and 10000 parts by mass or less.

2. The inorganic fluorescent nanoparticle composite according to claim 1, wherein the average particle diameter of the inorganic fine particles is 1 to 1000 nm.

3. The inorganic fluorescent nanoparticle composite according to claim 1, wherein the inorganic fine particle is made of alumina, silica, zirconia, zinc oxide, titanium oxide or cerium oxide.

4. The inorganic fluorescent nanoparticle composite according to claim 1, wherein the average particle diameter of the inorganic fluorescent nanoparticles is 1 to 100 nm.

5. The inorganic fluorescent nanoparticle composite according to claim 1, wherein the inorganic fluorescent nanoparticle is a quantum dot phosphor made of at least one member selected from the group consisting of CdS, CdSe, CdTe, ZnS, ZnSe, ZnTe, InP, GaN, GaAs, GaP, AlN, AlP, AlSb, InN, InAs, and InSb or a composite of two or more members selected from the group.

6. A wavelength conversion member formed so that the inorganic fluorescent nanoparticle composite according to claim 1 is dispersed in a glass matrix.

7. The wavelength conversion member according to claim 6, being formed of a sintered body of the inorganic fluorescent nanoparticle composite and a glass powder.

8. The wavelength conversion member according to claim 6, wherein the glass matrix is made of a Sn—P-based glass or a Sn—P—F-based glass.

9. The wavelength conversion member according to claim 7, wherein the glass powder has an average particle diameter of 0.1 to 100 µm.

* * * * *